(12) United States Patent
Ikeda

(10) Patent No.: US 7,061,819 B2
(45) Date of Patent: Jun. 13, 2006

(54) MEMORY DEVICE

(75) Inventor: Hitoshi Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/995,396

(22) Filed: Nov. 24, 2004

(65) Prior Publication Data
US 2005/0286329 A1   Dec. 29, 2005

(30) Foreign Application Priority Data
Jun. 29, 2004   (JP) .............................. 2004-191397

(51) Int. Cl.
G11C 7/00    (2006.01)

(52) U.S. Cl. ....................................... 365/222; 365/191
(58) Field of Classification Search ................ 365/222, 365/191

See application file for complete search history.

(56) References Cited

U.S. PATENT DOCUMENTS 4,317,169 A * 2/1982 Panepinto et al. .......... 711/106
6,950,363 B1 * 9/2005 Matsubara ................... 365/222

FOREIGN PATENT DOCUMENTS

JP           2001118383 A      4/2001

* cited by examiner

Primary Examiner—Michael T. Tran
(74) Attorney, Agent, or Firm—Arent Fox PLLC

(57) ABSTRACT

There is provided a memory device which has a refresh control circuit generating a refresh command internally; a refresh interrupt control circuit generating a refresh interrupt signal for accepting the refresh command for a predetermined period when a write command is inputted externally; a command decoder instructing, when a write command is inputted externally, a writing operation after a refresh command accepting period by the refresh interrupt signal finishes and after waiting a refreshing operation to finish if the refreshing operation is being performed; and a comparing circuit instructing a refreshing operation when the refresh command is generated during the refresh command accepting period by the refresh interrupt signal.

14 Claims, 7 Drawing Sheets

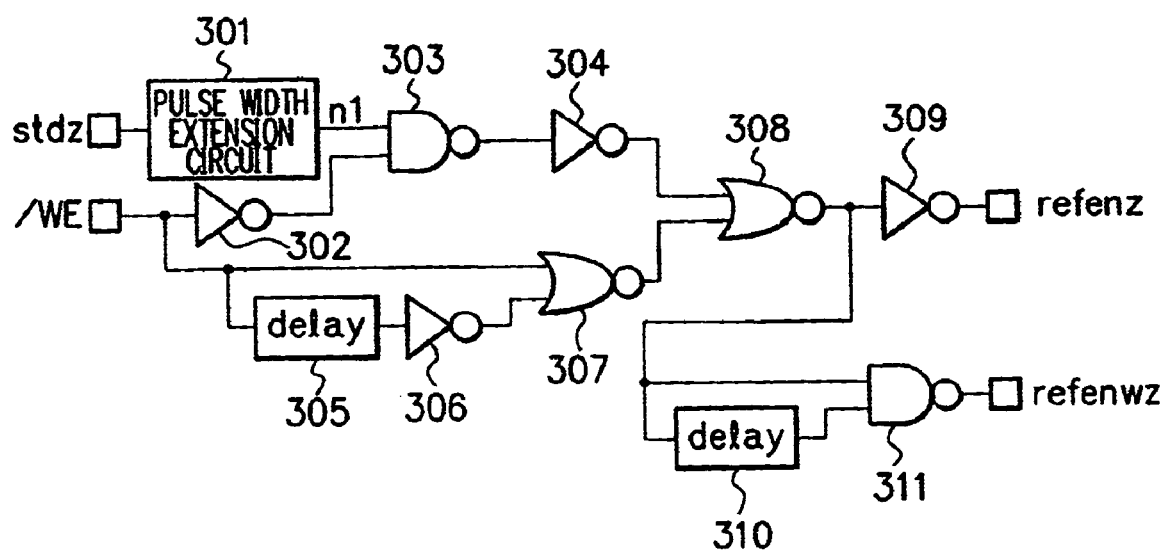
F I G. 3

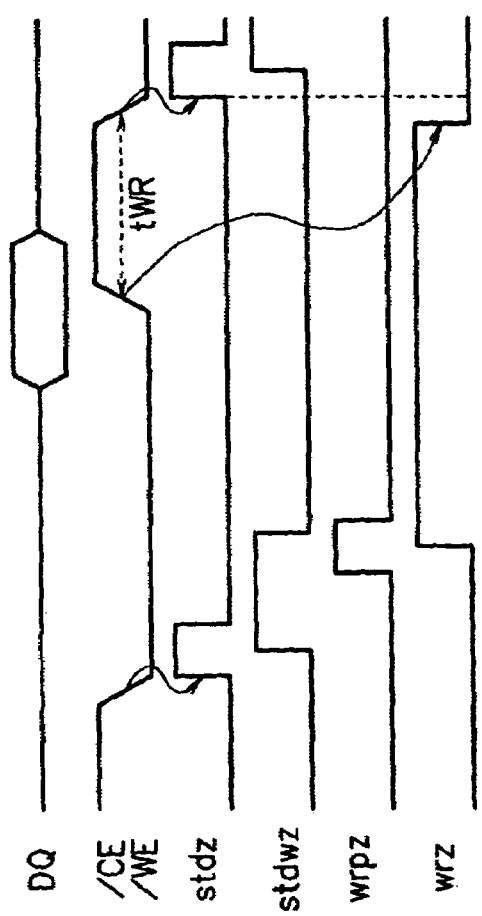
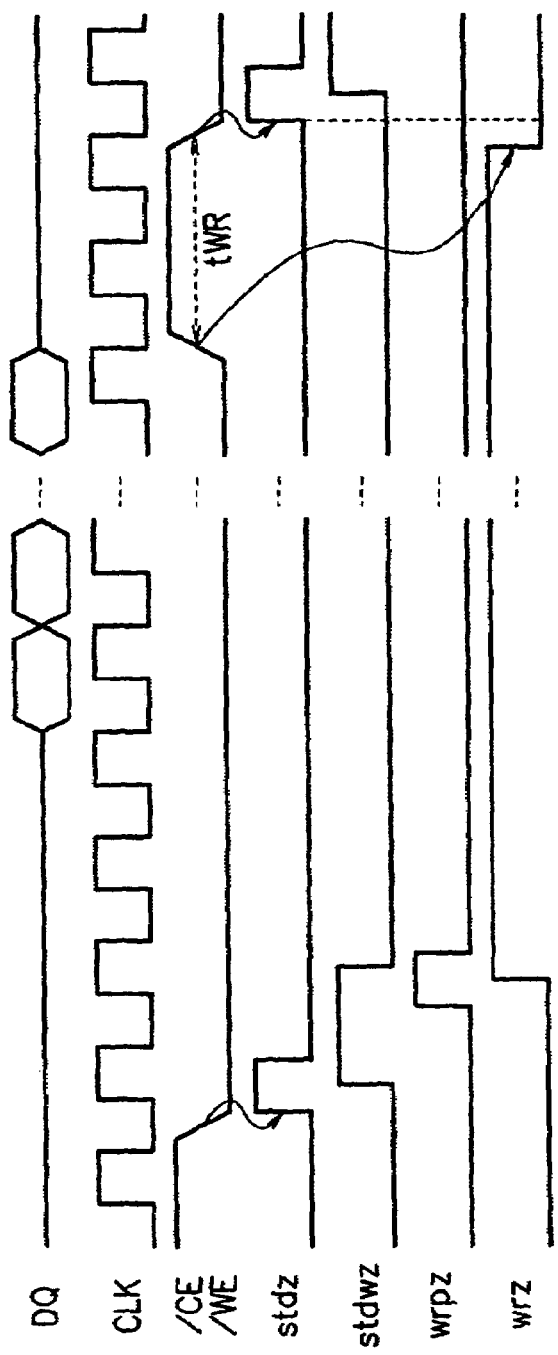
F I G. 5A
F I G. 5B

MEMORY DEVICE

CROSS-REFERENCE TO RELATED APPLICATIONS

This application is based upon and claims the benefit of priority from the prior Japanese Patent Application No. 2004-191397, filed on Jun. 29, 2004, the entire contents of which are incorporated herein by reference.

BACKGROUND OF THE INVENTION

1. Field of the Invention

The present invention relates to a memory device, and particularly relates to a memory device which performs refreshing.

2. Description of the Related Art

Since DRAM (dynamic random access memory) uses a memory cell constituted of one transistor and one capacitor, it needs periodic refreshing in order to store and retain data. One type of refreshing is performed according to an external refresh command and another type of refreshing is performed such that a memory device internally performs self refreshing automatically.

In Japanese Patent Application Laid-open No. 2001-118383, a DRAM which performs refreshing automatically and does not need an external refresh instruction is described.

SUMMARY OF THE INVENTION

An object of the present invention is to provide a memory device capable of performing self-refreshing between write commands without making a write recovery time long when the write commands are inputted consecutively.

According to one of the aspects of the present invention, there is provided a memory device which has a refresh control circuit generating a refresh command internally; a refresh interrupt control circuit generating a refresh interrupt signal for accepting the refresh command for a predetermined period when a write command is inputted externally; a command decoder instructing, when a write command is inputted externally, a writing operation after a refresh command accepting period by the refresh interrupt signal finishes and after waiting a refreshing operation to finish if the refreshing operation is being performed; and a comparing circuit instructing a refreshing operation when the refresh command is generated during the refresh command accepting period by the refresh interrupt signal.

BRIEF DESCRIPTION OF THE DRAWINGS

FIG. 3 is a circuit diagram showing a configuration example of the refresh interrupt control circuit in FIG. 2;

FIG. 5A and FIG. 5B are timing charts showing an operation of the semiconductor memory device in the case where write commands are inputted consecutively;

DETAILED DESCRIPTION OF THE PREFERRED EMBODIMENTS

Figure 1:
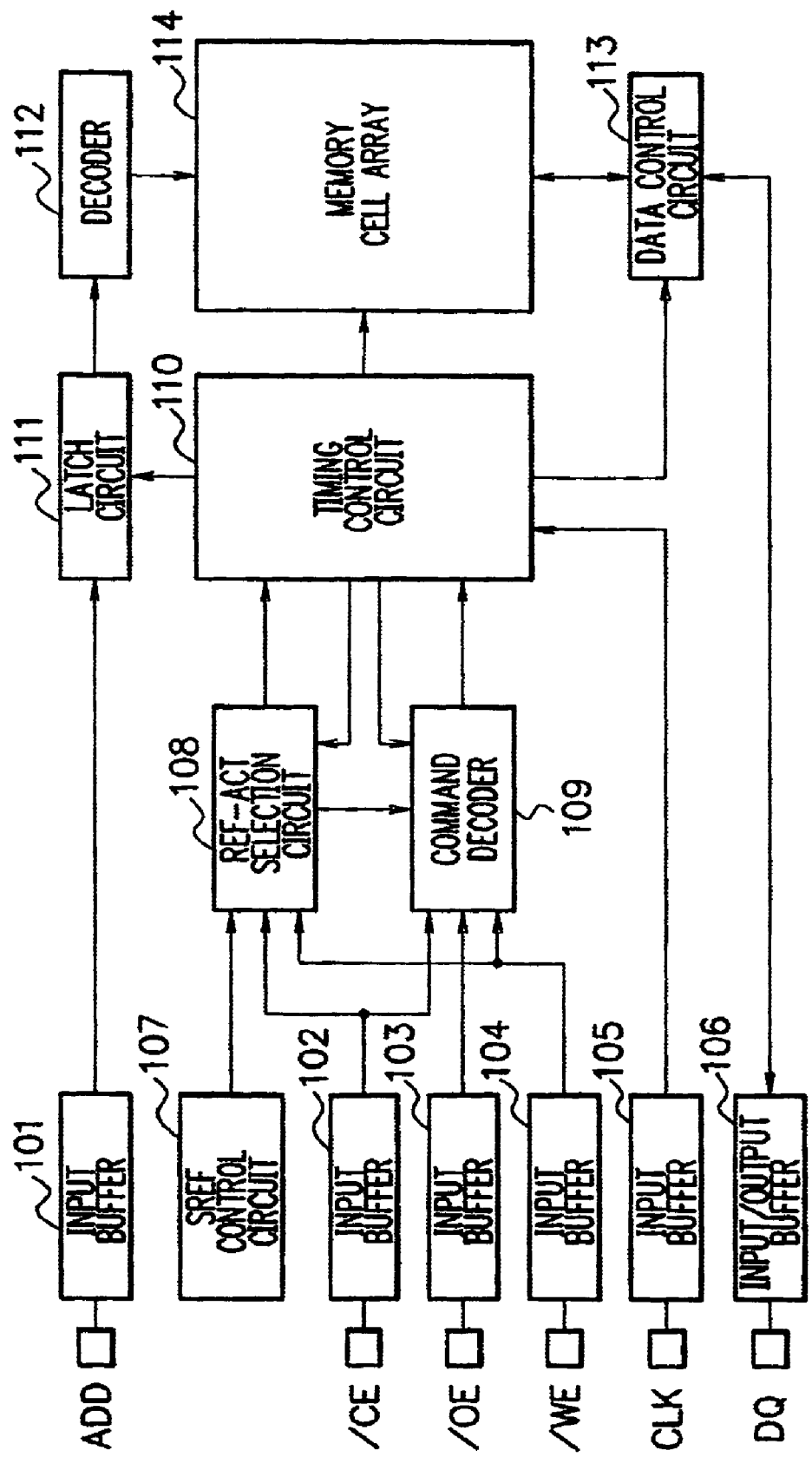
FIG. 1 is a block diagram showing a configuration example of a semiconductor memory device according to an embodiment of the present invention.

FIG. 1 is a block diagram showing a configuration example of a semiconductor memory device according to an embodiment of the present invention. An address signal ADD is buffered in an input buffer 101 and supplied to a latch circuit 111. A chip enable signal /CE is a signal for turning a semiconductor memory device (semiconductor chip) to enable state, and is buffered in an input buffer 102 and supplied to a REF-ACT selection circuit 108 and a command decoder 109. An output enable signal /OE is a signal for reading data, and is buffered in an input buffer 103 and supplied to the command decoder 109. A write enable signal /WE is a signal for writing data, and is buffered in an input buffer 104 and supplied to the REF-ACT selection circuit 108 and the command decoder 109. A clock signal CLK is buffered in an input buffer 105 and supplied to a timing control circuit 110. Data DQ is read data or write data, which is buffered in an input/output buffer 106 and inputted to/outputted from a data control circuit 113.

A self refresh control circuit 107 has a timer, internally and periodically generates a refresh command signal for refreshing memory cells, and outputs it to the REF-ACT selection circuit 108. The command decoder 109 generates a write command signal, a read command signal, and an output disable signal based on the signals /CE /WE and /OE. The write command signal is generated by turning the signals /CE and /WE to low level. The read command signal is generated by turning the signals /CE and /OE to low level. The output disable (hereinafter, referred to as OD) command signal is generated by turning the signal /CE to low level and turning the signals /WE and /OE to high level. An OD state is a state of not accessing memory cells. Depending on a specification, there may be a case that a reading operation or a writing operation is instructed after the OD state.

The REF-ACT selection circuit.108 compares a refresh (REF) command signal with an access (ACT) command signal and selects which command to perform. The access command signal is a command signal which is supplied externally such as a write command signal, read command signal, OD command signal, and the like. Specifically, when the refresh command signal and the access command signal compete with each other, the REF-ACT selection circuit 108 decides which of them has priority.

The timing control circuit 110 controls timing of operating a memory cell array 114, timing for the latch circuit 111 to latch the address signal ADD, and timing for the data control circuit 113 to input/output the data DQ to/from the memory cell array 114. The timing control circuit 110 performs counting of latency and burst length by the clock signal CLK when operating in synchronization.

The decoder 112 selects one memory cell in the memory cell array 114 according to the address signal ADD supplied from the latch circuit 111. In the selected memory cell, reading, writing or refreshing of data is performed according to a command.

Figure 2:
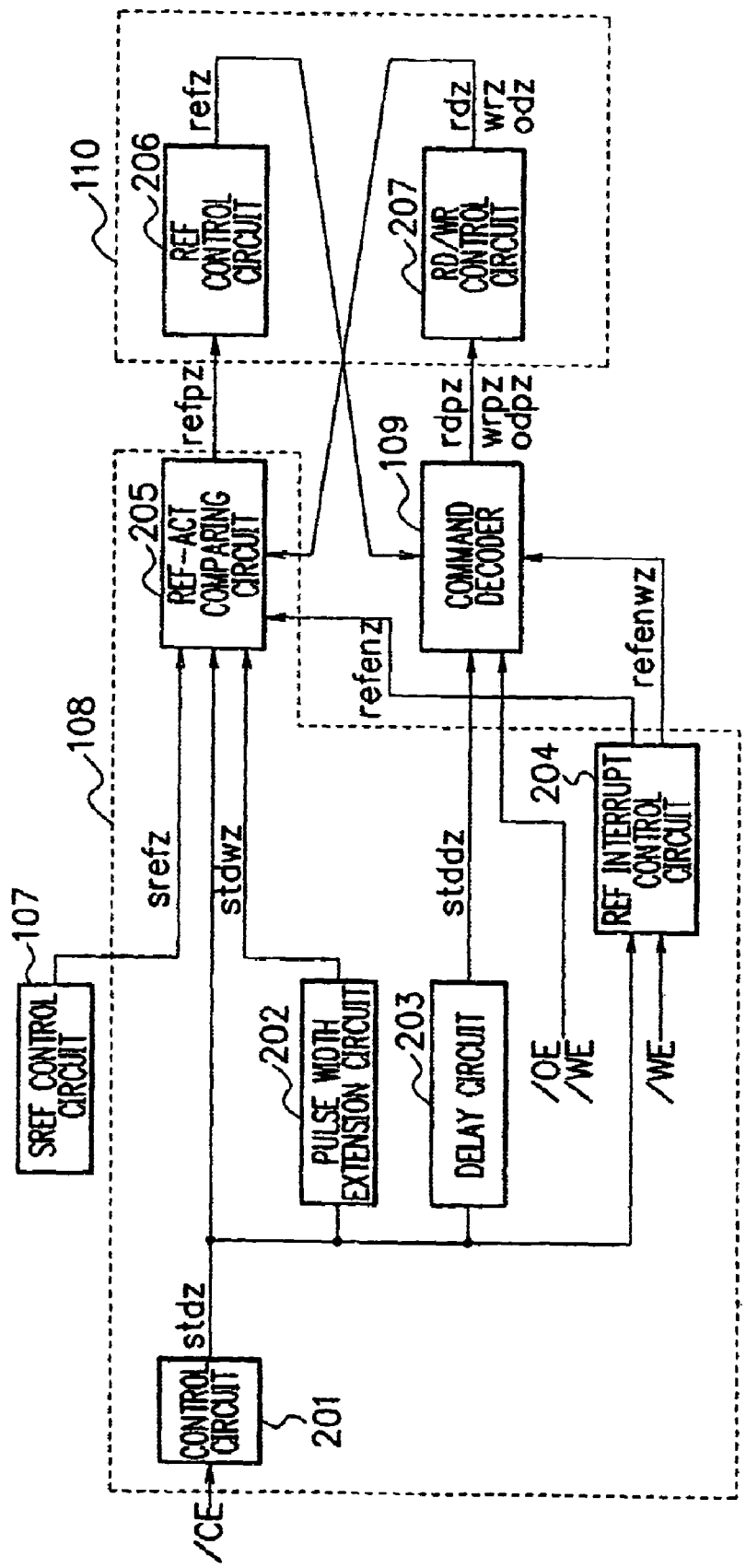
FIG. 2 is a block diagram showing a detailed configuration example of one part of the semiconductor memory device in FIG. 1.

FIG. 2 is a block diagram showing a detailed configuration example of one part of the semiconductor memory device in FIG. 1. FIG. 4A, FIG. 4B, FIG. 5A, FIG. 5B, FIG. 6 and FIG. 7 are timing charts for describing operations thereof. The REF-ACT selection circuit 108 has a control circuit 201, a pulse width extension circuit 202, a delay circuit 203, a refresh interrupt control circuit 204 and a REF-ACT comparing circuit 205. The timing control circuit 110 has a refresh control circuit 206 and a read/write control circuit 207.

The control circuit 201 generates a pulse signal stdz when the chip enable signal /CE falls. The pulse width extension circuit 202 generates a signal stdwz made by extending the pulse width of the signal stdz. The delay circuit 203 outputs a signal stddz made by delaying the signal stdz. The refresh interrupt control circuit 204 generates signals refenz and refenwz which become high level when the signal stdz is high level and the write enable signal /WE is low level. The signal refenz and refenwz are different in pulse width. The self refresh control circuit 107 periodically outputs a refresh command signal srefz in a pulse form.

When the refresh command signal srefz is inputted, the REF-ACT comparing circuit 205 outputs a refresh command signal refpz according to access command signals rdz, wrz, and odz and the signals stdz, stdwz, and refenz. When the refresh command and the access command compete with each other, either one of them will be given priority. When the access command is given priority, the refresh command signal refpz is outputted after an accessing operation thereof.

The command decoder 109 inputs the signal stddz, the output enable signal /OE, the write enable signal /WE, the signal refenwz, and a refresh signal refz, and outputs a read command signal rdpz, a write command signal wrpz, and an OD command signal odpz. When the refresh signal refz is high level, it means that refreshing is being performed, so that the access command signals rdpz, wrpz, and odpz are made to wait until the refreshing finishes.

When the refresh command signal refpz is inputted, the refresh control circuit 206 outputs a refresh signal refz which denotes that a refreshing operation is being performed. When the access command signals rdpz, wrpz, and odpz are inputted, the read/write control circuit 207 outputs access signals rdz, wrz, and odz which denote that an accessing operation is being performed. The read signal rdz denotes that a reading operation is being performed, the write signal wrz denotes that a writing operation is being performed, and the OD signal odz denotes that it is in the OD state.

FIG. 3 is a circuit diagram showing a configuration example of the refresh interrupt control circuit 204 in FIG. 2. A pulse width extension circuit 301 extends the pulse width of the signal stdz and outputs a signal n1. An inverter 302 outputs a signal made by logically inverting the write enable signal /WE. The Negative AND (NAND) circuit 303 inputs an output signal of the inverter 302 and the signal n1 and outputs a NAND signal of these signals. An inverter 304 outputs a signal made by logically inverting an output signal of the NAND circuit 303. A delay circuit 305 outputs a signal made by delaying the write enable signal /WE. An inverter 306 outputs a signal made by logically inverting an output signal of the delay circuit 305. A Negative OR (NOR) circuit 307 inputs an output signal of the inverter 306 and the write enable signal /WE, and outputs a NOR signal of these signals. A NOR circuit 308 inputs output signals of the inverter 304 and the NOR circuit 307, and outputs a NOR signal of these signals. An inverter 309 outputs a signal refenz made by logically inverting an output signal of the NOR circuit 308. A delay circuit 310 outputs a signal made by delaying an output signal of the NOR circuit 308. A NAND circuit 311 inputs output signals of the NOR circuit 308 and the delay circuit 310, and outputs a NAND signal refenwz of these signals.

Figure 4B:
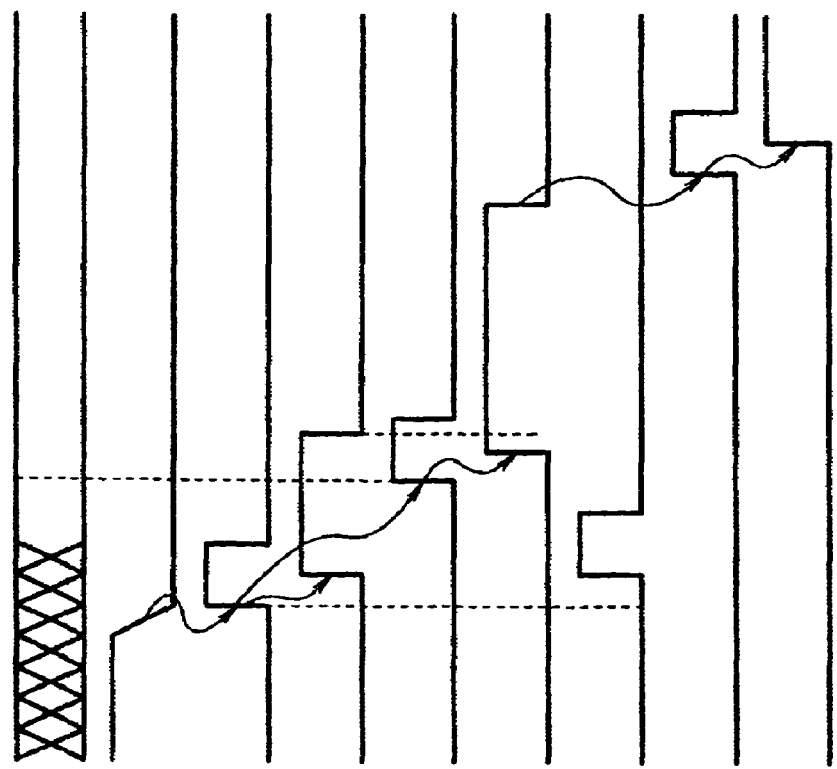
FIG. 4A and FIG. 4B are timing charts showing an operation in the case where a refresh command and a read command compete with each other.
Figure 4A:
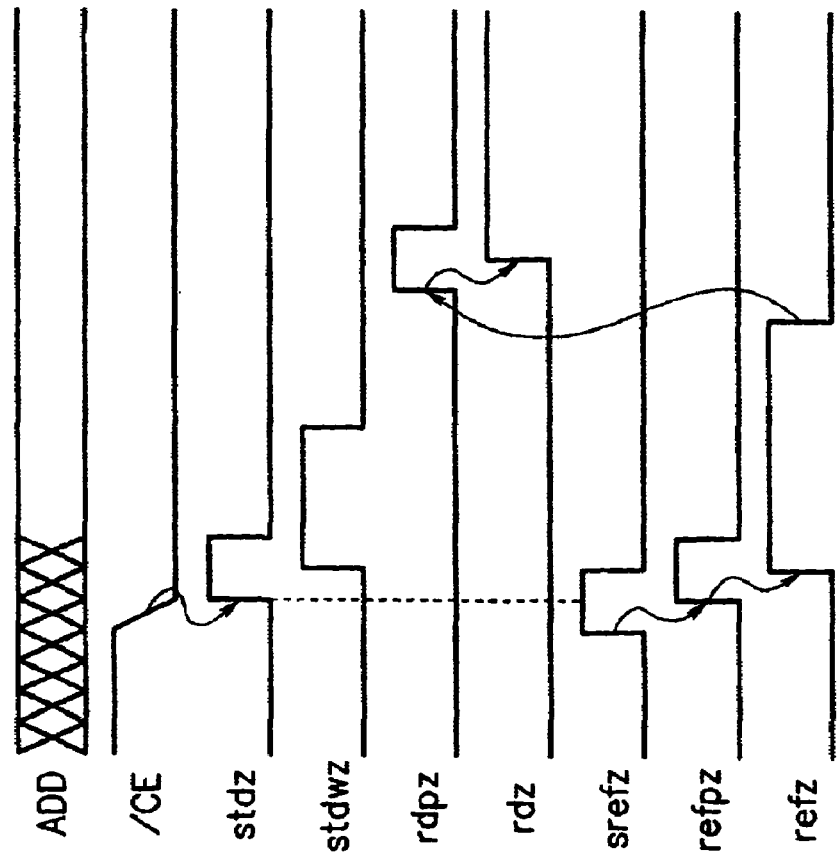

FIG. 4A is a timing chart showing an operation in the case where a refresh command and a read command compete with each other and then a refreshing operation is given priority. In a semiconductor memory device internally and periodically performing refreshing, the refreshing operation is stopped internally so that the refreshing is not performed when an access command is inputted.

The refresh command signal srefz is periodically outputted by the self refresh control circuit 107. The signal stdz is outputted when a fall of signals /CE, /WE or a change of address signal ADD is detected by the control circuit 201. In this case, by a fall of chip enable signal /CE and a change of address signal ADD, a read command is detected and the signal stdz is outputted. The REF-ACT comparing circuit 205 performs control for comparing this refresh command signal srefz with the signal stdz, performing an operation which inputted first, and, until this operation finishes, keeping an operation inputted thereafter waiting.

Specifically, when a rise of refresh command signal srefz is inputted, the REF-ACT comparing circuit 205 outputs the refresh command signal refpz because the signal stdz is low level. The refresh control circuit 206 inputs the refresh command signal refpz and outputs a refresh signal refz which denotes that a refreshing operation is being performed. In other words, when a refresh command comes earlier than a read command, the refresh command has priority.

The signal stddz is a signal made by extending the pulse width of the signal stdz by the pulse width extension circuit 202. When the signal stddz rises in a state that a read command is inputted, the command decoder 109 waits until the refresh signal refz becomes low level, and when it becomes low level, the command decoder 109 outputs a read command rdpz. When the read command rdpz is inputted, the read/write control circuit 207 outputs a read signal rdz which denotes that a reading operation is being performed.

FIG. 4B is a timing chart showing an operation in the case where a refresh command and a read command compete with each other and then a reading operation is given priority.

When the signal stdz rises, the command decoder 109 generates a read command signal rdpz to perform a reading operation because the refresh command signal srefz is low level. At this time, the read command signal rdpz is generated based on a signal stddz made by delaying the signal stdz. This is because there may be a case that a setup time of the address signal ADD with respect to the chip enable signal /CE is minus. Specifically, there may be a case that the address signal ADD is not determined at the time when the chip enable signal /CE falls, and then the address signal ADD is determined after a predetermined time has passed therefrom. When it is attempted to start a reading operation as soon as generating the signal stdz at the fall of chip enable signal /CE, the address signal ADD is not determined, so that the delay circuit 203 is provided so as to start the reading operation after the address signal ADD is determined. The command decoder 109 instructs to start the reading operation after a read command is inputted and a predetermined period passes so that the address signal ADD is determined.

The read signal rdz is a signal which denotes that a reading operation is being performed. Even when the refresh command signal srefz is inputted, the REF-ACT comparing circuit 205 stops refresh commands while the signal stdwz is high level or the read signal rdz is high level. When the reading operation finishes and the read signal rdz becomes low level, a refresh command signal refpz is outputted, and a refresh signal refz which denotes that the refreshing operation is being performed is outputted. Since there is a gap from the fall of signal stdz to the rise of signal rdz, the refresh command is stopped also by the signal stdwz made by extending the pulse width of the signal stdz so that the refresh command does not interrupt therein.

As described above, when a read command is inputted externally, the command decoder 109 instructs a reading operation with priority even if the refresh command signal srefz is generated thereafter, and after the reading operation finishes, the REF-ACT comparing circuit 205 instructs a refreshing operation.

FIG. 5A is a timing chart showing an operation of an asynchronous semiconductor memory device in the case where write commands are inputted consecutively.

During a writing operation, the chip enable signal /CE and the write enable signal /WE become low level. The control circuit 201 outputs a signal stdz when the chip enable signal /CE (and the write enable signal /WE) falls. The signal stdwz is a signal made by extending the pulse width of the signal stdz. When a signal stdddz made by delaying the signal stdz rises, the command decoder 109 outputs a write command signal wrpz. When the write command signal wrpz is inputted, the read/write control circuit 207 turns a write signal wrz to high level, which denotes that a writing operation is being performed.

Thereafter, write data DQ is taken at the rise of chip enable signal /CE and write enable signal, /WE, a writing operation to a memory cell is performed, the write signal wrz is turned to low level, and the writing operation is finished. Next, when the chip enable signal /CE and the write enable signal /WE fall, the next writing operation is performed. A write recovery time tWR is defined as a time for writing data to the memory cell. The write recovery time tWR is a period in which the chip enable signal /CE and the write enable signal /WE are high level. When the write recovery time tWR becomes short, the signals /CE and /WE become low level before the write signal wrz becomes low level, and the signal stdz is outputted. When a high level period of the write signal wrz and a high level period of the signal stdz overlap, the refreshing operation cannot be performed and data in a cell is erased. Therefore, the write recovery time tWR is determined according to whether the refreshing can be performed or not. In a semiconductor memory device to which the refresh command is inputted externally, refreshing is not necessary to be performed between a write command and a read command, so that the write signal wrz only needs to be low level before the write command signal wrpz is outputted. Accordingly, in the semiconductor memory device which generates a refresh command internally, refreshing should be performed after the writing operation, so that the write recovery time tWR must be made long.

FIG. 5B is a timing chart showing an operation of a synchronous semiconductor memory device in the case where write commands are inputted consecutively.

In this synchronous operation, the last data DQ is written in a memory cell and a writing operation is finished. The difference from the asynchronous operation in FIG. 5A is the timing of taking the data DQ. In the asynchronous operation in FIG. 5A, the data DQ is taken at a rise of chip enable signal /CE and write enable signal /WE. In the synchronous operation in FIG. 5B, the data DQ is taken in synchronization with a clock signal CLK and written to a memory cell. Regarding the write recovery time tWR, similarly to the asynchronous operation, refreshing cannot be performed if the signal stdz is outputted based on a fall of chip enable signal /CE before the write signal wrz becomes low level. The write recovery time tWR is determined by this timing.

The write data DQ is inputted at the rise of signals /CE and /WE in the asynchronous type and is inputted after latency in the synchronous type, so that there is a time from falling of the signal /CE to inputting of the data DQ. Accordingly, there is no need to start a writing operation immediately at the fall of signal /CE. In the reading operations in FIG. 4A and FIG. 4B, the signal stdz is outputted at the fall of signal /CE to stop refreshing in order to make access fast, but in the writing operation, performing of refreshing after the signal stdz is outputted would not be a problem. Inversely, by allowing refreshing to interrupt before the writing operation, the write recovery time tWR can be improved. In other words, the write recovery time tWR can be shortened by changing the period of stopping the refreshing in the writing operation and in the reading operation, and by enabling to perform refreshing until just before the writing operation is started at the time of writing.

In FIG. 2, the REF-ACT comparing circuit 205 compares the refresh command with the access command, and when the refreshing operation is selected, it immediately generates the refresh command signal refpz based on the refresh command signal srefz. The refresh control circuit 206 turns the refresh signal refz to high level when the refresh command signal refpz is inputted, and turns the refresh signal refz to low level when the refreshing operation finishes. The command decoder 109 outputs the access command signals rdpz, wrpz, and odpz based on the signal stdddz, but making the output to wait while the refresh signal refz is being high level. The read/write control circuit 207 turns the access signals rdz, wrz, and odz to high level respectively when the access command signals rdpz, wrpz, and odpz are inputted, turns the signal rdz/wrz to low level when the reading/writing operation finishes, and turns the OD signal odz to low level when it is no longer in the OD state. When any one of the signals stdz, stdwz, rdz, wrz, and odz is high level, the REF-ACT comparing circuit 205 stops the output signal refpz even if the refresh command signal srefz is inputted, but when the signal refenz is high level, it ignores the signals stdz, stdwz and outputs the signal refpz. The signal refenz is a signal for making time to perform refreshing before a writing operation and is generated by the refresh interrupt control circuit 204. The refresh interrupt control circuit 204 turns the signal refenz to high level when the signal /WE is low level and the signal stdz is high level and for a predetermined period from the fall of signal /WE so as to allow refreshing. Further, a signal refenwz is outputted so that the writing operation is not performed during this period and stops outputting the signal wrpz at the command decoder 109.

The writing operation is divided into two cases of writing after being through the OD state and writing without having been through the OD state. In other words, there are cases of inputting the write command after an OD command and inputting the write command when not being in the OD state. These two cases are shown in FIG. 6 and FIG. 7.

Figure 6:
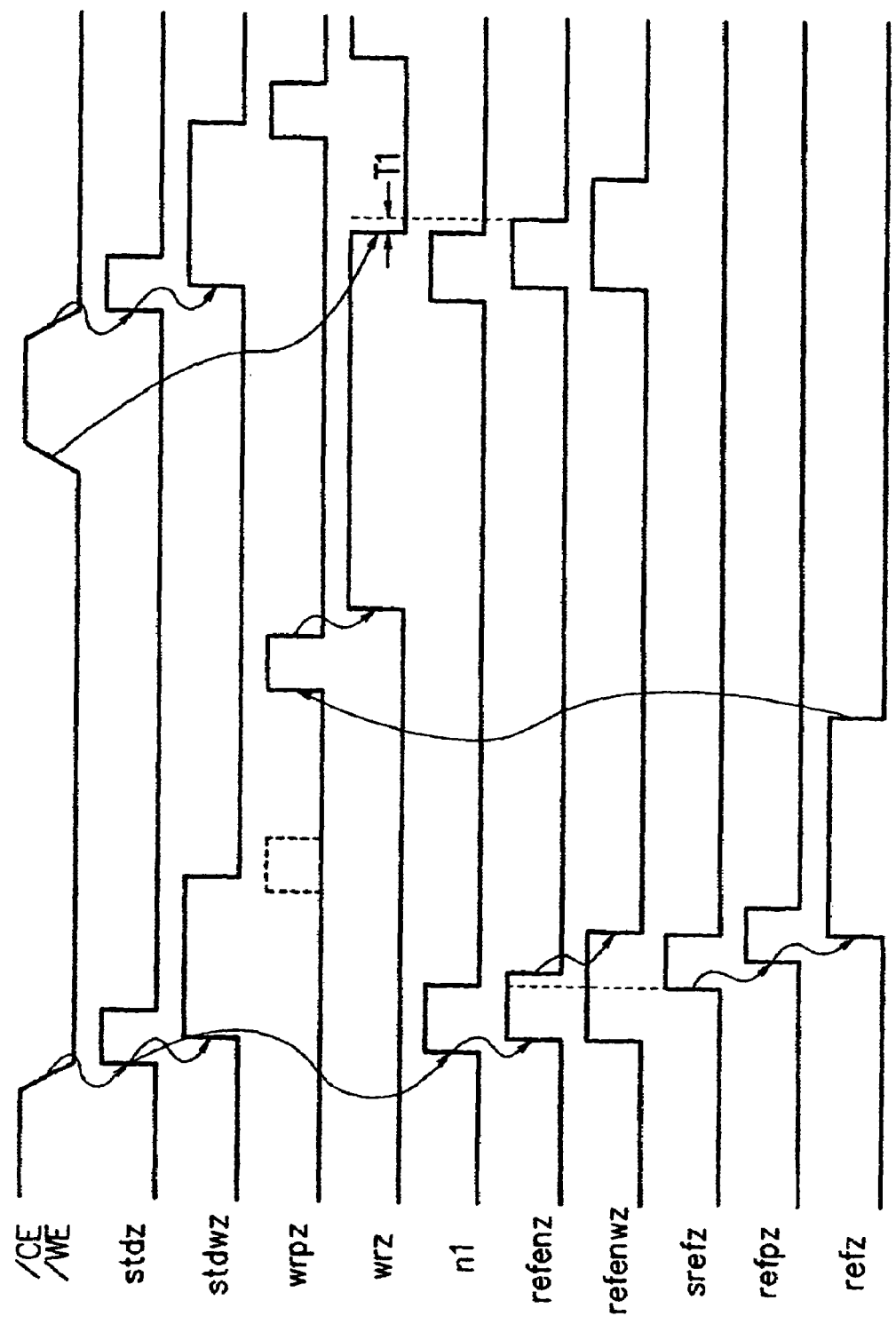
FIG. 6 is a timing chart showing a writing operation without having been through an OD state.
Figure 7:
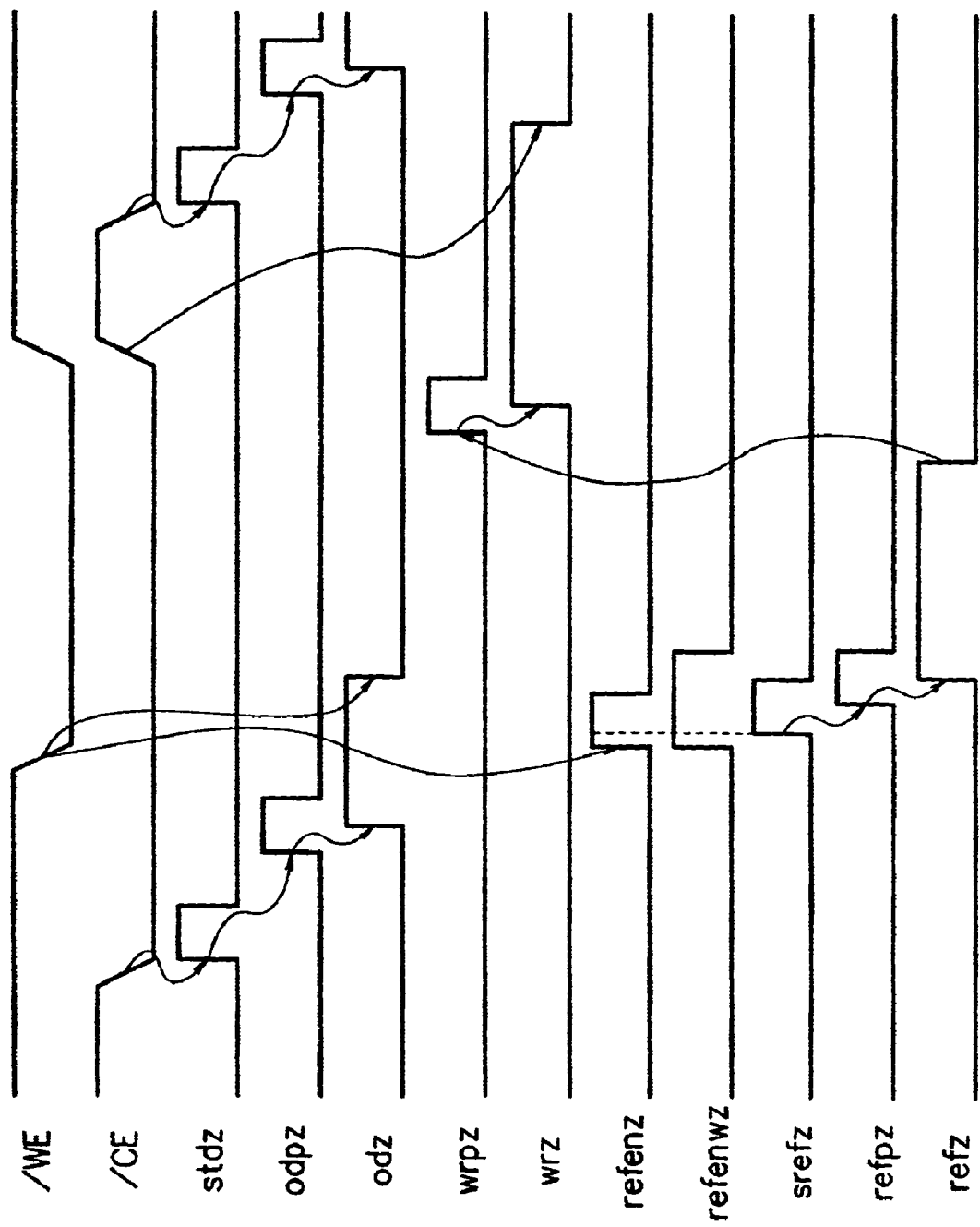
FIG. 7 is a timing chart showing a writing operation after the OD state.

FIG. 6 is a timing chart showing a writing operation without having been through the OD state. In the case of writing operation, the signal /WE becomes low level at the same time as the low level of the signal /CE or before the low level of the signal /CE.

When the chip enable signal /CE (and the write enable signal /WE) falls, the control circuit 201 outputs a signal stdz. The signal stdwz is a signal made by extending the pulse width of the signal stdz. The signal n1 is a signal made by extending the pulse width of the signal stdz by the pulse width extension circuit 301. The signal refenz becomes high level at the time when the signal /WE is low level and the signal n1 made by extending the signal stdz is high level and for a predetermined period from a fall of signal /WE. The signal refenwz is a signal made by delaying a fall of signal refenz.

The command decoder 109 attempts to output the write command signal wrpz when the signal stddz made by delaying the signal stdz rises, but during a period that the signal refenwz is high level or the refresh signal refz is high level, it does not output the write command signal wrpz.

When the signal n1 is high level, the signal refenz becomes high level because the signal /WE is low level. If the signal srefz is outputted while the signal refenz is being high level, the REF-ACT comparing circuit 205 outputs the refresh command signal refpz. When the refresh command signal refpz is inputted, the refresh control circuit 206 turns the refresh signal refz to high level. In this case, the refreshing operation is performed first, and the writing operation is made to wait.

After the refreshing operation finishes and the refresh signal refz becomes low level, the command decoder 109 outputs the write command signal wrpz. When the write command signal wrpz is inputted, the read/write control circuit 207 turns the write signal wrz to high level during the writing operation. Thereafter, at the rise of chip enable signal /CE and write enable signal /WE, write data DQ is taken, the writing operation to a memory cell is performed, the write signal wrz is turned to low level, and the writing operation is finished.

When write commands are consecutively and externally inputted, the same operation as described above is performed. At this time, a period T1 from the fall of write signal wrz to the fall of signal refenz is the period to accept refresh commands. When the refresh command signal srefz is generated during the period T1, the refreshing operation is performed with priority. Thus, by providing the period T1, the self refreshing can be performed with priority between consecutive write commands.

Further, by allowing refreshing to interrupt before the writing operation, the write recovery time tWR can be improved. Specifically, the write recovery time tWR can be shortened by changing a period for stopping the refreshing between the writing operation and the reading operation and by allowing the refreshing to be performed until just before the writing operation is started at the time of writing.

FIG. 7 is a timing chart showing a writing operation after an OD state. The OD state is a state that the signal /CE is low level and the signals /WE and /OE are high level. The write command is instructed externally by turning the signals /CE and /WE to low level. When the signal stdz rises in a state that the signal /CE is low level and the signals /WE and /OE are high level, the command decoder 109 outputs the OD command signal odpz. When the OD command signal odpz is inputted, the read/write control circuit 207 turns the OD signal odz to high level until the signal /WE becomes low level.

When the signal /OE turns to low level in the OD state, data needs to be outputted as soon as it is read, so that the refreshing needs to be stopped when being in the OD state. Since the OD signal odz is high level in the OD state, the REF-ACT comparing circuit 205 stops outputting of the refresh command signal srefpz. Thereafter, when the signal /OE turns to low level, the read command signal rdpz is outputted, the OD signal odz turns to low level, the read signal rdz turns to high level, and the reading operation is performed.

When the refresh command signal srefz is generated during a period from inputting of the OD command to inputting of the write command, the REF-ACT comparing circuit 205 makes the refreshing operation to wait.

Further, when the signal /WR becomes low level in the OD state and the refresh command signal srefz is not present, the write command signal wrpz is outputted, the OD signal odz turns to low level, the write signal wrz becomes high level, and the writing operation is performed.

Next, the case where the write command and the refresh command compete with each other will be described. When the write command is inputted externally after the OD state, the refresh interrupt control circuit 204 generates a pulse based on a fall of signal /WE to turn the signal refenz to high level. When the refresh command signal srefz rises during a period that the signal refenz is high level, the REF-ACT comparing circuit 205 outputs the refresh command signal refpz. When the refresh command signal refpz is inputted, the refresh control circuit 206 turns the refresh signal refz to high level until the refreshing operation finishes.

When the signal /WE falls, the command decoder 109 attempts to output the write command signal wrpz, but during a period that the signal refenwz is high level or the refresh signal refz is high level, it does not output the write command signal wrpz. When the refresh signal refz becomes low level, the write command signal wrpz is outputted. When the write command signal wrpz is inputted, the read/write control circuit 207 turns the write signal wrz to high level. Thereafter, write data DQ is taken at rises of chip enable signal /CE and write enable signal /WE, a writing operation is performed to a memory cell, the write signal wrz is turned to low level, and the writing operation is finished.

Thus, it is possible to allow refreshing to interrupt before the writing operation. A process of performing the writing operation after the refreshing operation finishes is the same as the writing operation without having been through the OD state in FIG. 6. During the reading operation, the refresh command is stopped as soon as the read command is inputted, but the write recovery time tWR can be shortened without making the access time late by allowing the refresh to be performed until just before the writing operation is started at the time of writing.

As described above, the self refresh control circuit 107 generates the refresh command signal srefz internally. When the write command is inputted externally, the refresh interrupt control circuit 204 generates the refresh interrupt signals refenz and refenwz for accepting the refresh command signal srefz for a predetermined period. When the write command is inputted externally, the command decoder 109 instructs the writing operation after a refresh command accepting period by the refresh interrupt signal refenwz finishes and after waiting a refreshing operation to finish if the refreshing operation is being performed. When the refresh command signal srefz is generated during the refreshing command accepting period by the refresh interrupt signal refenz, the REF-ACT comparing circuit 205 instructs the refreshing operation.

The present embodiments are to be considered in all respects as illustrative and no restrictive, and all changes which come within the meaning and range of equivalency of the claims are therefore intended to be embraced therein.

The invention may be embodied in other specific forms without departing from the spirit or essential characteristics thereof.

The write recovery time can be shortened by allowing refreshing to be performed until just before starting the writing operation at the time of writing.

What is claimed is:

1. A memory device, comprising:
   a refresh control circuit generating a refresh command internally;
   a refresh interrupt control circuit generating a refresh interrupt signal for accepting the refresh command for a certain period when a write command is inputted externally;
   a command decoder instructing, when a write command is inputted externally, a writing operation after a refresh command accepting period by the refresh interrupt signal finishes and after waiting a refreshing operation to finish if the refreshing operation is being performed; and
   a comparing circuit instructing a refreshing operation when the refresh command is generated during the refresh command accepting period by the refresh interrupt signal.

2. The memory device according to claim 1,
   wherein said command decoder instructs, when a read command is inputted externally, a reading operation with priority even if the refresh command is generated thereafter, and
   wherein said comparing circuit instructs the refreshing operation after the reading operation finishes.

3. The memory device according to claim 1,
   wherein the write command is inputted after an output disable command.

4. The memory device according to claim 1,
   wherein the write command is inputted when not being in an output disable state.

5. The memory device according to claim 3,
   wherein said comparing circuit makes a refreshing operation to wait when the refresh command is generated in a period from inputting the output disable command to inputting the write command.

6. The memory device according to claim 1,
   wherein said refresh control circuit periodically generates the refresh command.

7. The memory device according to claim 1, further comprising:
   a memory cell configured to perform a writing operation and a refreshing operation according to the write command and the refresh command.

8. The memory device according to claim 2,
   wherein said command decoder instructs the reading operation after the read command is inputted and a certain period passes so that an address is determined.

9. The memory device according to claim 2,
   wherein said refresh control circuit periodically generates the refresh command.

10. The memory device according to claim 9, further comprising:
    a memory cell configured to perform a writing operation and a refreshing operation according to the write command and the refresh command.

11. The memory device according to claim 10,
    wherein said command decoder instructs the writing operation after the write command is inputted and a certain period passes so that an address is determined.

12. The memory device according to claim 11,
    wherein the write command is inputted after an output disable command.

13. The memory device according to claim 11,
    wherein the write command is inputted when not being in an output disable state.

14. The memory device according to claim 12,
    wherein said comparing circuit makes a refreshing operation to wait when the refresh command is generated in a period from inputting the output disable command to inputting the write command.

* * * * *